(12) United States Patent
Otremba

(10) Patent No.: US 9,093,437 B2
(45) Date of Patent: Jul. 28, 2015

(54) PACKAGED VERTICAL POWER DEVICE COMPRISING COMPRESSIVE STRESS AND METHOD OF MAKING A PACKAGED VERTICAL POWER DEVICE

(71) Applicant: Infineon Technologies AG, Neubiberg (DE)

(72) Inventor: Ralf Otremba, Kaufbeuren (DE)

(73) Assignee: Infineon Technologies AG, Neubiberg (DE)

( * ) Notice: Subject to any disclaimer, the term of this patent is extended or adjusted under 35 U.S.C. 154(b) by 35 days.

(21) Appl. No.: 13/705,041

(22) Filed: Dec. 4, 2012

(65) Prior Publication Data

US 2014/0151717 A1    Jun. 5, 2014

(51) Int. Cl.
*H01L 23/495*  (2006.01)
*H01L 21/50*   (2006.01)
*H01L 29/16*   (2006.01)

(52) U.S. Cl.
CPC .......... *H01L 23/49575* (2013.01); *H01L 21/50* (2013.01); *H01L 23/49513* (2013.01); *H01L 23/49562* (2013.01); *H01L 29/1608* (2013.01); *H01L 2224/32245* (2013.01); *H01L 2224/45144* (2013.01); *H01L 2224/48091* (2013.01); *H01L 2224/48247* (2013.01); *H01L 2224/73265* (2013.01); *H01L 2224/85099* (2013.01); *H01L 2924/1305* (2013.01); *H01L 2924/13055* (2013.01); *H01L 2924/13062* (2013.01); *H01L 2924/13091* (2013.01); *H01L 2924/3025* (2013.01)

(58) Field of Classification Search
CPC ................. H01L 23/49513; H01L 23/49572; H01L 23/49575; H01L 23/49562; H01L 29/1608
USPC ................... 257/633, 747, 669, 178, E23.04; 438/118, 119
See application file for complete search history.

(56) References Cited

U.S. PATENT DOCUMENTS

| | | | |
|---|---|---|---|
| 5,049,976 A * | 9/1991 | Demmin et al. | 257/782 |
| 2003/0001249 A1 | 1/2003 | Shimanuki | |
| 2004/0089942 A1 * | 5/2004 | Mamitsu et al. | 257/718 |
| 2005/0179109 A1 | 8/2005 | Ma et al. | |
| 2005/0287846 A1 * | 12/2005 | Dozen et al. | 439/85 |
| 2006/0043579 A1 * | 3/2006 | He et al. | 257/712 |
| 2007/0152328 A1 * | 7/2007 | Jadhav et al. | 257/734 |
| 2009/0166826 A1 * | 7/2009 | Janducayan et al. | 257/676 |

(Continued)

FOREIGN PATENT DOCUMENTS

DE    102012102124 A1    9/2012

OTHER PUBLICATIONS

Baltes, H., et al., "Advanced Micro- and Nanosystems," CMOS-MEMS, 2005, Figure 6.14, vol. 2, Wiley-VCH, Weinheim.

(Continued)

*Primary Examiner* — Kimberly Rizkallah
*Assistant Examiner* — Maria Ligai
(74) *Attorney, Agent, or Firm* — Slater & Matsil, L.L.P.

(57) ABSTRACT

A packaged vertical semiconductive device including a compressive stress and a method of making such a packaged vertical semiconductive device are disclosed. In one embodiment an assembled device includes a carrier, a connection layer disposed on the carrier, the connection layer having a first height, and a chip disposed on the connection layer, the chip having a second height, wherein the second height is smaller than the first height.

18 Claims, 6 Drawing Sheets

(56) References Cited

U.S. PATENT DOCUMENTS

| | | | |
|---|---|---|---|
| 2009/0278244 A1* | 11/2009 | Dunne et al. | 257/676 |
| 2010/0051963 A1 | 3/2010 | Otremba | |
| 2011/0037153 A1* | 2/2011 | Zhu et al. | 257/676 |
| 2012/0061812 A1 | 3/2012 | Otremba | |
| 2012/0235227 A1 | 9/2012 | Otremba et al. | |
| 2012/0313190 A1* | 12/2012 | Goel et al. | 257/416 |

OTHER PUBLICATIONS

Abdullah, Z., et al., "High Temperature Storage Performance for Au Sn Diffusion Soldering on Cu Leadframe Substrate," 34th International Electronic Manufacturing Technology Conference, 2010, 4 pages.

"Total Strained Silicon," Technologies and Applications, Paul Scherrer Institute, Oct. 24, 2012, 2 pages.

* cited by examiner

PACKAGED VERTICAL POWER DEVICE COMPRISING COMPRESSIVE STRESS AND METHOD OF MAKING A PACKAGED VERTICAL POWER DEVICE

TECHNICAL FIELD

The present invention relates generally to the packaging of semiconductor chips and more particularly to packaging of vertical power semiconductor power chips.

BACKGROUND

Packaging and assembly constitute the last phase of a single or multiple chip fabrication. Packaging and assembly provide mechanical and electrical connections between a chip and a chip carrier and a protective enclosure against mechanical, chemical or irradiation induced damage.

Thermo-mechanical stress induced defects such as layer delamination, crack formation or solder joint failures typically provide potential reliability problems for component lifetimes.

SUMMARY OF THE INVENTION

In accordance with an embodiment of the invention an assembled device comprises a carrier, a connection layer disposed on the carrier, the connection layer comprising a first height and a chip disposed on the connection layer, the chip comprising a second height, wherein the second height is smaller than the first height.

In accordance with an embodiment of the invention a packaged power device comprises a leadframe, a connection layer disposed on a carrier and a vertical power semiconductor chip disposed on the connection layer, wherein the vertical power semiconductor chip comprises a compressive stress over an entire height. The packaged power device further comprising interconnects connecting chip contact pads to leads of the leadframe and an encapsulation encapsulating the vertical power semiconductor chip.

In accordance with an embodiment of the invention a method of manufacturing a semiconductor device comprises placing a vertical semiconductor device with a bottom main surface on a leadframe and connecting the semiconductor device via a connection layer to the leadframe thereby forming a compressive stress over an entire height of the semiconductor device, the connection layer being higher than the semiconductor device.

BRIEF DESCRIPTION OF THE DRAWINGS

For a more complete understanding of the present invention, and the advantages thereof, reference is now made to the following descriptions taken in conjunction with the accompanying drawings, in which:

FIG. 1 illustrates in cross-sectional view a chip/carrier assembly, wherein FIG. 1a shows the assembly at the very beginning of die-to-carrier bonding while

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to embodiments in a specific context, namely with respect to packaged vertical power semiconductor chips. The invention may also be applied, however, to other packaged semiconductor devices or packaged components.

Figure 1B:
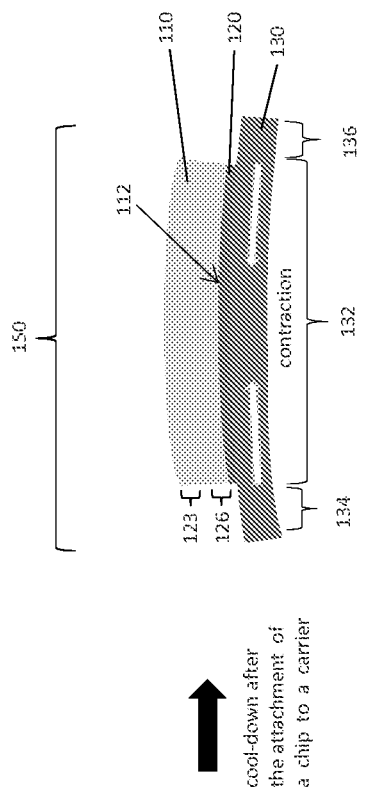
FIG. 1b shows the bonded assembly after cool-down.
Figure 1A:
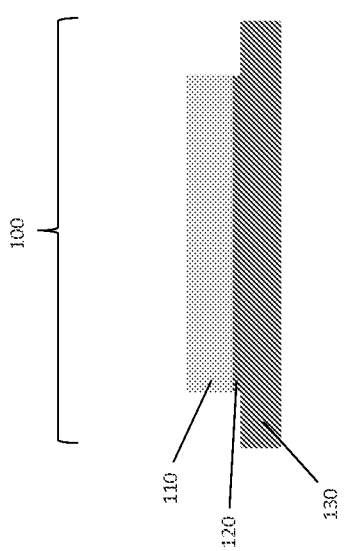

Stress within a packaged component may be produced at interfaces of adjacent component architecture elements as the result of high temperature processing. A typical example for processing related stress formation is illustrated in FIG. 1. FIG. 1 shows the transition from the beginning to the end of a die-to-carrier attachment process. FIG. 1a illustrates an assembly 100 at the moment of first physical contact between a die (chip) 110 and a carrier 130, wherein the carrier 130 is covered with a connecting layer 120 or wherein the backside of the die 110 is covered with the connecting layer 120. At this initial stage of bonding the contact interface is essentially stress-free, with the exception of stress caused which may be caused by the deposition of the connecting layer 120.

A significant level of additional stress is introduced after completion of the die 110/carrier 130 bonding which generally occurs at temperatures between 200° C. and 400° C. and subsequent cool-down to room temperature. The state of a bonded die 110/carrier 130 assembly 150 is illustrated in FIG. 1b. During the cool-down from the bonding temperature to room temperature the various elements of the component architecture contract at a varying degree since their coefficients of thermal expansion (CTE) differ. In consequence, a shape distortion of the assembly 150 occurs, leading to a slight bowing of the assembly 150. In general such bowing may occur in upward or downward direction. For the exemplary case depicted in FIG. 1b downward bowing is shown in an exaggerated manner. A shape distortion of this type may be observed, for example, when applying a metallic carrier exhibiting comparatively high CTEs to a semiconductor die.

Embodiments of the present invention provide compressive stress for vertical power semiconductor devices wherein the vertical power semiconductor chip comprises a height of equal to or less than 40 μm. Embodiments of the present invention provide compressive stress for vertical power devices wherein a height of the connection layer is equal or greater than the height of the vertical semiconductor power chip.

Figure 2:
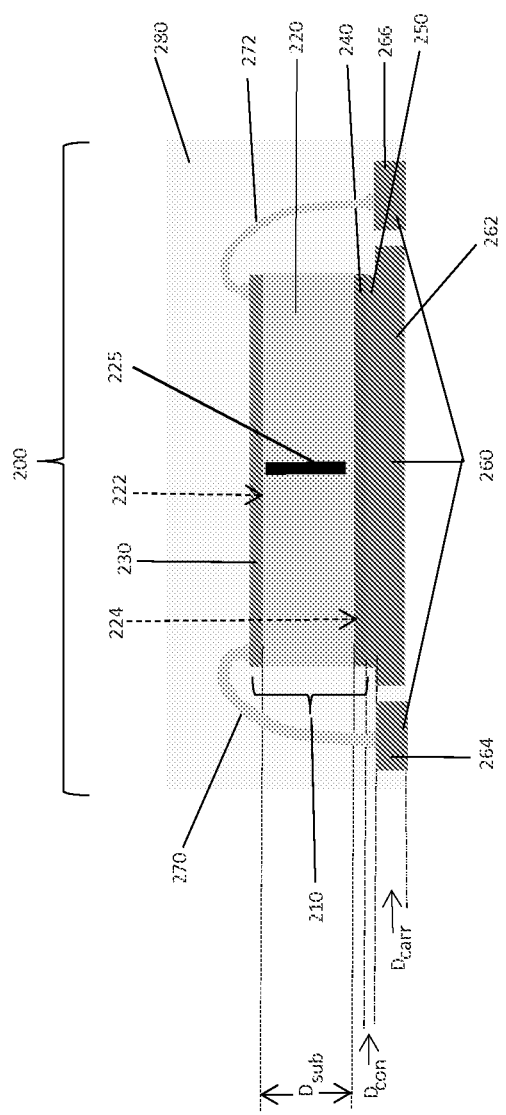
FIG. 2 illustrates a cross-sectional view of an embodiment of a packaged vertical power semiconductor device comprising compressive stress over the entire height of the vertical power semiconductor chip.

FIG. 2 illustrates in cross-sectional view an embodiment of a packaged electrical component 200 comprising a thermo-mechanical stress configured to improve electrical device performance. The packaged component 200 comprises a semiconductor chip 210, a carrier 260, and a connecting layer 250 connecting the chip 210 with the carrier 260. The semiconductor chip 210 comprises a semiconductor substrate 220, a terminal layer 230 disposed over a first (upper) major surface 222 of the semiconductor substrate 220, and a backside metallization (BSM) layer 240 disposed below a second (lower) major surface 224 of the substrate 220.

The semiconductor substrate 220 may comprise a single semiconductor material such as silicon or germanium, or a compound semiconductor material. In various embodiments, the compound semiconductor material is silicon carbide (SiC). In other embodiments, the compound semiconductor material is SiGe, GaN, GaASs, GaP, InP or InAs, or a combination thereof.

The semiconductor materials may exhibit relatively low CTE values in the range between about 2 ppm/K to about 7 ppm/K. For example, the CTEs of Si and GaN are about 2.3 ppm/K and about 3.2 ppm/K, respectively. The semiconductor substrate 220 may comprise a plate of bulk semiconductor material. Alternatively the substrate 220 may also comprise an epitaxial semiconductor layer disposed over bulk semiconductor material. The bulk and/or the epitaxial semiconductor may include regions comprising dopants to enhance electrical conductivity. In some embodiments, the semiconductor substrate 220 may comprise inorganic or organic materials which are not semiconductors.

The semiconductor chip 210 may be a vertical power semiconductor device. In a vertical power semiconductor device the current flows parallel to a vertical direction, e.g., in direction of the height (also referred herein as thickness) $D_{sub}$. In the embodiment shown in FIG. 2 the current flows in the direction 225 or perpendicular to the main major surfaces 222/224 of the chip 210.

The semiconductor chip 210 may comprise the following type of devices: power MOSFETs (Metal Oxide Semiconductor Field Effect Transistors), JFETs (Junction Gate Field Effect Transistors), IGBTs (Insulated Gate Bipolar Transistors), power bipolar transistors or power diodes. In one embodiment the semiconductor chip 210 comprises a plurality of power devices or a combination of different devices. Alternatively, the semiconductor chip 210 may comprise an integrated circuit comprising additional elements such as control devices, electro-optical or electro-mechanical circuits, or even passive elements. In other embodiments the semiconductor substrate comprises a non-power vertical transistor.

In one embodiment the semiconductor chip 210 comprises compressive stress equal to or larger than 100 MPa in a direction perpendicular to the main surfaces 222/224 of the substrate 220, e.g., in a direction parallel to the current flow through the vertical power device. Alternatively, the compressive stress is equal to or larger than 200 MPa, or equal to or larger than 500 MPa. A stress of this magnitude and sign produces a significant improvement in the electrical performance of the power device(s) 210. The performance enhancement may be derived from an increase of electron mobility as a result of a stress-induced reduction of the effective electron mass and a reduction of electron scattering in the critical device regions. The obtained performance enhancement may be reflected in higher device speed and lower power consumption.

In various embodiments, the semiconductor chip 210 is a thin chip. The thickness values (height) $D_{sub}$ of the semiconductor chip 210 may be an important parameter with respect to device performance enhancement. The thickness values $D_{sub}$ of the semiconductor chip 210 may be small compared to semiconductor substrate thickness values generally found in conventional component architectures. In numerous embodiments, the thickness $D_{sub}$ of the semiconductor chip 210 is equal to or less than about 40 µm. Alternatively, semiconductor chip 210 is equal to or less than 30 µm or equal to or less than 20 µm thick. In some embodiments the semiconductor chip 210 is between 20 µm and 40 µm thick.

In various embodiments, the semiconductor chip 210 is an ultra-thin chip. The thickness values $D_{sub}$ of the semiconductor chip 210 may be only a few µm thick. For example, the semiconductor chip 210 may be equal to or less than 10 µm, or equal to or less than 5 µm thick. In some embodiments the thicknesses $D_{sub}$ is between 2 µm and 4 µm or 5 µm.

The semiconductor chip 210 may comprise a terminal or passivation layer 230 formed on the first (upper) major main surface 222 of the semiconductor substrate 220. The passivation layer 230 may comprise or define electrically conductive contact pads and insulating elements (not shown) which insulate the contact pads from each other. The contact pads may comprise of a high-conductivity metal such as copper or aluminum and may include a gold coating. The contact pads are part of interconnection paths enabling load current flow and signal transmission. In some embodiments, the semiconductor substrate 220 comprises a power transistor having the source contact pad (alternatively, the drain contact pads) and gate contact pads on the top surface 222 of the substrate 220.

In some embodiments the semiconductor chip 210 comprises a backside metallization (BSM) layer 240 disposed on the backside 224 of the semiconductor substrate 220. The BSM layer (stack) 240 may comprise one or more layers comprising metal or metal alloys. For example, the BSM layer 240 comprises Cu/W/Ti, Au/Cu/Cr, Al/Ti, Al/TiW, Al/Ti/NiV, or Al/Ti(W)/Cu/Sn/Ag. The thickness or height of the BSM layer (stack) 240 may be in the range between about 50 µm and about 100 µm. Alternatively, the thickness of the BSM layer 240 may vary in a range between about 50 µm and about 200 µm or about 50 µm to about 300 µm. The BSM layer 240 may act as a low resistivity contact. In some embodiments, the BSM layer 240 is in electrical contact with either a source or a drain region of a power MOSFET. Due to its high thermal conductivity the BSM layer 240 may provide heat dissipation from devices in operation.

The semiconductor chip 210 is mounted on an electrically conducting carrier 260. In some embodiments, the CTE of the selected carrier 260 material is significantly greater than that of the semiconductor substrate 220 material. In some embodiments, the CTE of the carrier 260 may be greater by a factor 3 or 4 than that of semiconductor chip 210. In other embodiments the CTE of the carrier is greater by a factor 7, and occasionally greater by a factor of 10 than the CTE of the semiconductor material of the chip 210.

The chip 210 may be mounted on the central portion 262 ("paddle") of a carrier 260 such as a metallic lead frame. The carrier 260 may be a continuous plate or sheet made of a metal/alloy exhibiting a CTE equal to or greater than 15 ppm/K. For example, the lead frame may comprise copper (CTE: ~17 ppm/K), brass (CTE: ~20 ppm/K) or aluminum (CTE: ~23 ppm/K). Alternatively, the carrier 260 may be a metal-coated ceramic plate. In one embodiment the ceramic plate may comprises a ceramic material exhibiting a CTE equal to or greater than 10 ppm/K. It may comprise zirconia (CTE: ~10.5 ppm/K) or magnesia (CTE: ~13.5 ppm/K), for example. The height (also referred herein as thickness) $D_{carr}$ of the metallic or metal-coated ceramic carrier 260 may vary between about 50 µm and about 2000 µm. For example, the thickness $D_{carr}$ may be about 100 µm to 300 µm, or about 200 µm to about 500 µm. Alternatively, the thickness $D_{carr}$ may be equal to or greater than about 500 µm.

In various embodiment the connecting layer 250 comprises a soft solder material such as an Sn—Pb alloy of varying Sn/Pb ratio (e.g. eutectic Sn63Pb37 with a melting point of 183° C.), or an alloy of Bi or Cd with Sn or Pb, or an alloy of In with Pb and/or Sn and/or Ag. The melting points of soft solder materials are below 200° C., for some solder alloys comprising In or Bi melting temperature may only be around 120° C. The height (also referred herein as thickness) $D_{Con}$ of the soft solder material 250 may vary between about 50 μm and about 1000 μm. For example, the thickness $D_{Con}$ may be about 50 μm to 100 μm, or about 50 μm to about 200 μm. Alternatively, the thickness $D_{Con}$ may be equal to or greater than about 200 μm.

In various embodiments the connecting layer 250 may comprise an electrically conducting organic adhesive film or paste. Such films/pastes comprise a base polymer such as polyimide, epoxy, epoxy/urethane or polyester resins, a high load (between 70 volume-% to 85 volume-%) of metallic nano-particles, and a cross-linking compound. The nanoparticles may comprise Ag, Cu, Au, or Ag-plated or Au-plated Ni, for example. The thickness $D_{Con}$ of the film or paste material 250 may vary between about 50 μm and about 2000 μm. For example, the thickness $D_{Con}$ may be about 50 μm to 100 μm, or about 50 μm to about 200 μm. Alternatively, the thickness $D_{Con}$ may be equal to or greater than about 200 μm.

In some embodiments the connecting layer 250 may comprise a rigid layer of diffusion solder material such as AuSn, CuSn, AgSn or SnSb. Diffusion solder materials comprise tin or silver, but generally not lead. Diffusion solder materials melt at temperatures equal to or higher than about 210° C., which means that their melting points are at least about 20° C. higher than those of soft solder materials. The thickness $D_{Con}$ of the diffusion solder material may vary between about 1 μm to about 20 μm. Alternatively, the thickness $D_{Con}$ of the diffusion solder material may be equal to or less than about 10 μm or about 5 μm, e.g., between about 2 μm to about 3 μm or about 3 μm to about 5 μm.

In various embodiments the thin power semiconductor chip 210 is attached to the carrier 260 with a soft solder, an adhesive film or adhesive past 250. In numerous embodiments the ultra-thin power semiconductor chip 210 is attached to the carrier 260 with a diffusion bonded connection layer 250. The thickness or height of the carrier $D_{carr}$ may vary between about 10 μm and about 1000 μm. For example, the thickness $D_{carr}$ may be about 100 μm to 300 μm, or about 200 μm to about 500 μm. Alternatively, the thickness $D_{carr}$ may be equal to or greater than about 500 μm.

The assembled component 200 further comprises interconnection elements 270, 272 which provide electrical connectivity between contact pads in the terminal layer 230 and peripheral leadframe regions 264, 266. The interconnect elements 270, 272 may be wire bonds or pre-fabricated (e.g., punched-out) metal parts, so-called clips. Clips and wire bonds of larger diameters, generally ranging from 100 μm to 500 μm, may be used for interconnects in the load path of the electric system. Au wires with diameters of 12 μm to 50 μm may be used for signal interconnects.

The electrical component 200 comprises an encapsulant 280 which fully or partially encloses the semiconductor chip 210, the carrier 260 and interconnects such as the wire bonds 270, 272. The encapsulant 280 may comprise a molding compound which may comprise epoxy, polyimide, polyacrylate, polyurethane, polysulfone or polyetherimide resins. Alternatively the encapsulant 280 may be a laminate or a glop top coating, for example.

In the following paragraphs different embodiments of the packaged component 200 comprising compressive stress in the semiconductor substrate 220 are discussed. In general, the magnitude of the stress originating from a particular component interface will rise with increasing difference in the CTEs of the materials forming the interface and with increasing temperature of the deposition/attachment processes leading to the formation of the interface.

With respect to the particular architectural structure of the packaged component 200, the majority, if not all of the materials comprised in layers underlying the semiconductor substrate 220 may exhibit CTEs which are higher, often significantly higher, than the CTE(s) of employed by semiconductor substrate 220 material(s). This holds true for metals such as Ti (CTE between about 8.5 to about 9.5 ppm/K), and Ni, Au, Cu or Al (with CTEs varying between about 13 ppm/K and about 23 ppm/K) which are potential material choices for the backside metallization (BSM) layer 240.

Solder materials usable for the connecting layer 250 exhibit generally CTE values equal to or higher than about 15 ppm/K. For example, eutectic Au80Sn20 has a CTE of about 16 ppm/K and eutectic Sn63Pb37 a CTE of about 25 ppm/K.

The CTE of a connecting layer 250 comprising an organic conductive adhesive may be close to or higher than about 20 ppm/K. The averaged CTE of such an adhesive film or paste depends mainly on the CTE of the material forming metallic nanoparticles (comprising e.g. Ag with a CTE of about 18 ppm/K) and the CTE of the base resin compound (being e.g., ≥about 25 ppm/K for polyimides, or ≥50 about ppm/K for epoxy resins).

The CTEs of conventional metallic carriers 260 are equal to or higher than about 17 ppm/K, as mentioned before. Alternatively, ceramic carrier materials are available which exhibit CTEs higher than about 10 ppm/K.

During a cool-down phase after material deposition all of the above mentioned materials may contract stronger than the proposed semiconductor substrate 220 materials. In consequence, the corresponding layers underlying the semiconductor substrate 220 may all contribute to compressive stress emanating into the semiconductor substrate 220.

Figure 3:
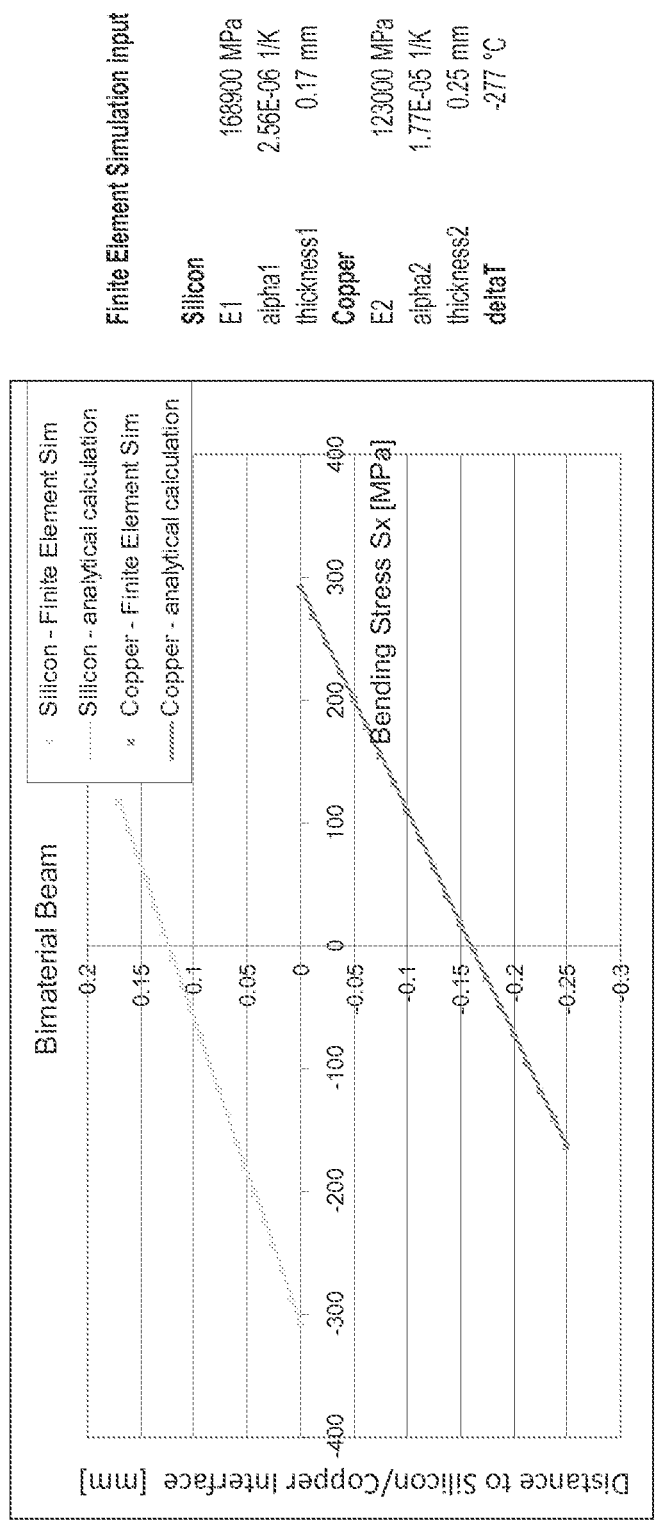
FIG. 3 shows simulation data concerning stress formation in a silicon/copper bilayer.
Figure 4:
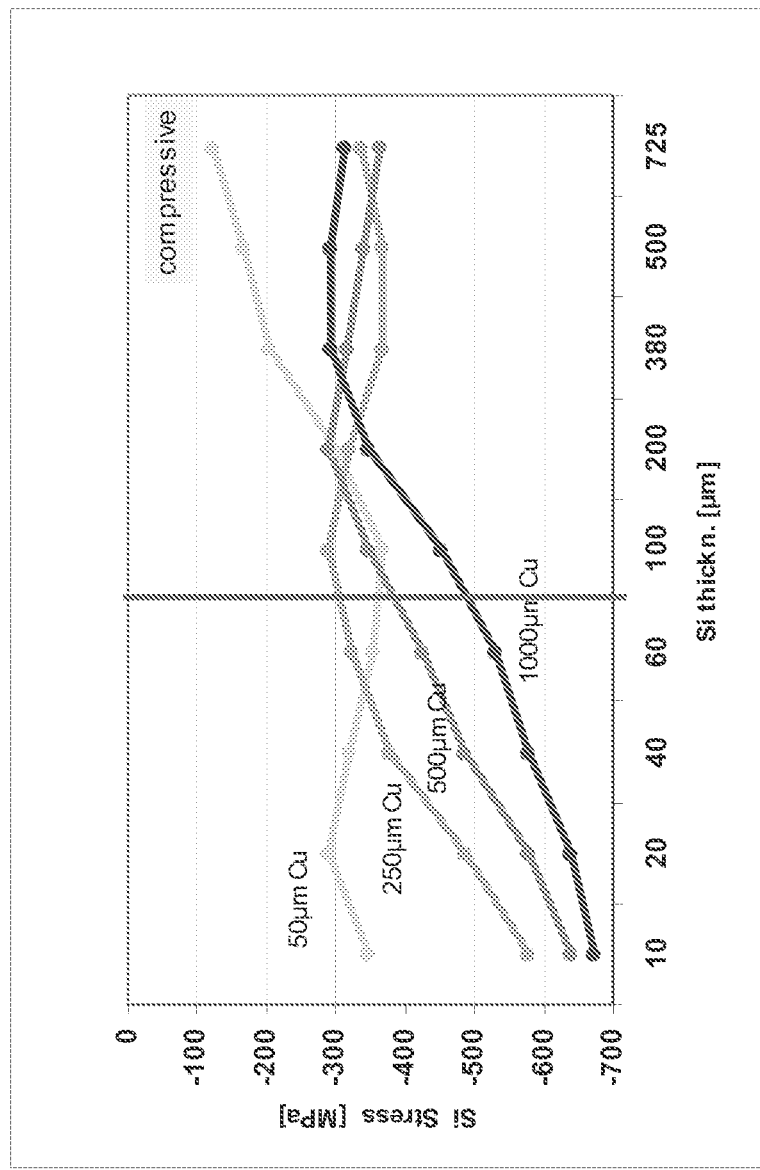
FIG. 4 shows a plot of experimental data illustrating the variation of stress at the bottom surface of a silicon chip for a silicon chip/copper leadframe interface.
Figure 5:
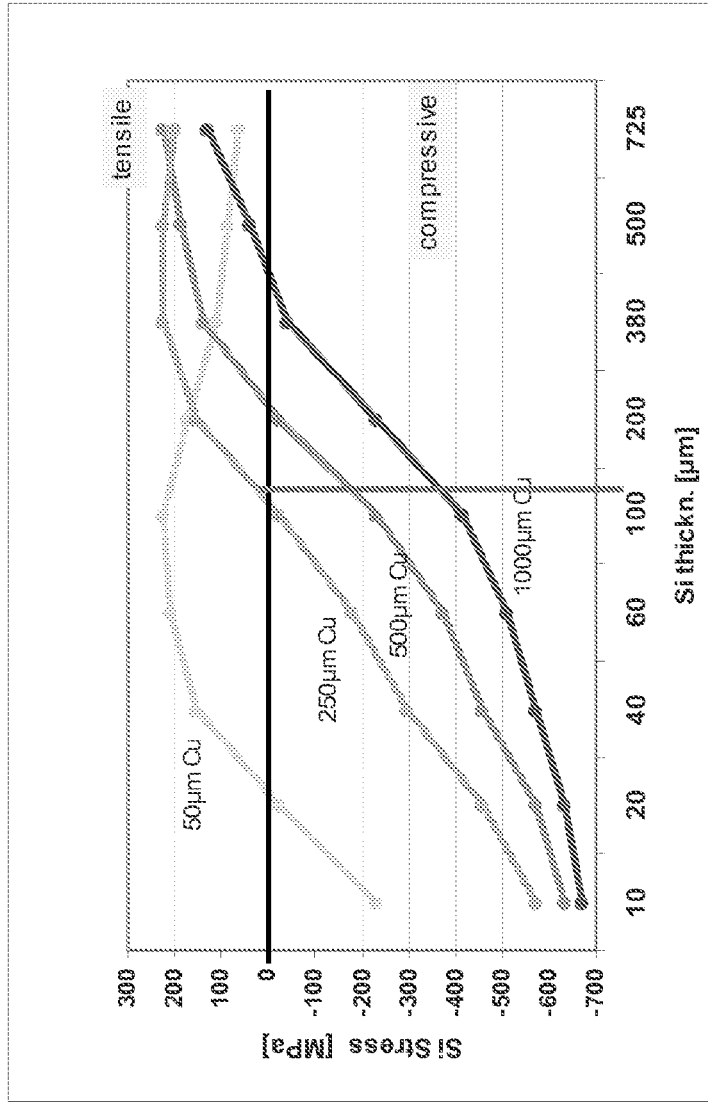
FIG. 5 shows a plot of experimental data illustrating the variation of stress at the top surface of the silicon chip for a silicon chip/copper leadframe interface.

The impact of absolute thickness values and thickness ratios of individual elements of the component 200 architecture may be better understood with respect to FIGS. 3-5. These figures show data with respect to stress in bilayers formed by the bonding of a silicon layer to a copper layer at 300° C. Since the CTE of silicon is lower than that of copper, the discussed silicon/copper bilayer assemblies may be regarded as simplified test cases for electrical component assemblies (e.g., assembly 200) comprising a semiconductor substrate overlying a stack of layers comprising materials with CTEs which are higher than the CTE of the semiconductor substrate.

FIG. 3 shows a plot of Finite Element Simulation and Analytical Calculation data concerning the variation of stress in a bilayer comprising a 170 nm thick silicon layer bonded to a copper substrate of 250 nm thickness. The Finite Element Simulations shows data for discrete values of the distance from the silicon/copper interface. The Analytical Calculation program provides data for a continuous variation of this distance.

The two applied simulation methods furnished identical results. Compressive stress (indicated by negative stress values) is predicted to be found across the whole copper substrate thickness. In the silicon layer compressive stress degrades continuously and eventually even turns tensile with increasing distance from the silicon/copper interface. For the given values of silicon and copper thickness, silicon regions adjacent to the interface to copper are evidently compressed while silicon regions farther away from copper are stretched out. The simulations predict compressive stress equal to or higher than 200 MPa for silicon thickness values equal to or lower than 40 µm.

In various embodiments the combination of semiconductive CTE(s), connection layer CTE(s), back-side metallization layer CTE(s) and/or carrier CTE(s) provide a compressive stress over the entire thickness (height) of the semiconductive substrate (or chip). In some embodiment, the combination of these CTEs does not provide a tensile stress and in particular a tensile stress at the top surface of the semiconductive substrate (or chip). In numerous embodiments the semiconductive substrate is compressive if the ratio of the connection layer thickness to the semiconductor substrate (or chip) thickness is 1.5:1 or 2:1, or 2.5:1. In many embodiments the semiconductive substrate is compressive if the ratio of the backside metallization layer thickness to the semiconductor substrate (or chip) thickness is 1.5:1 or 2:1, or 2.5:1.

FIGS. 4 and 5 provide experimental data for silicon chip/ copper lead frame interface formed at 300° C. FIG. 4 shows the stress at the bottom surface and FIG. 5 shows the stress at the top surface. The silicon thickness was varied between 10 µm and 725 µm, and the copper thickness of the lead frame was varied between 50 µm and 1000 µm.

In agreement with the simulation data shown in FIG. 3, the experimental data of FIGS. 4 and 5 confirm for a copper thickness range of 250 µm to 1000 µm a moderate degradation of compressive stress in the silicon substrate and an eventual conversion to tensile stress with increasing distance from the silicon/copper interface. Compressive stress was found to increase the thicker the copper layer was in comparison to the silicon layer. For a copper thickness range of 250 µm to 1000 µm compressive stress values of −300 MPa or higher were measured across the whole silicon thickness in case the silicon thickness was 40 µm or lower. A value of −300 MPa exceeds the value of −100 MPa, considered the minimum stress value to induce a significant performance improvement in an electric device, by a factor of 3.

Compressive stress formation becomes more difficult in thicker silicon layers which become more difficult to distort by the mechanical forces originating from the silicon/copper interface. When combining a silicon thickness of 380 µm with a copper thickness of 1000 µm, for example, compressive stress in silicon was found to be rather low (only about 40 MPa). In some embodiments the silicon thickness should not be greater than 40 µm or 50 µm because tensile and/or lower stress which may not provide the desired electrical performance improvement.

Figure 6:
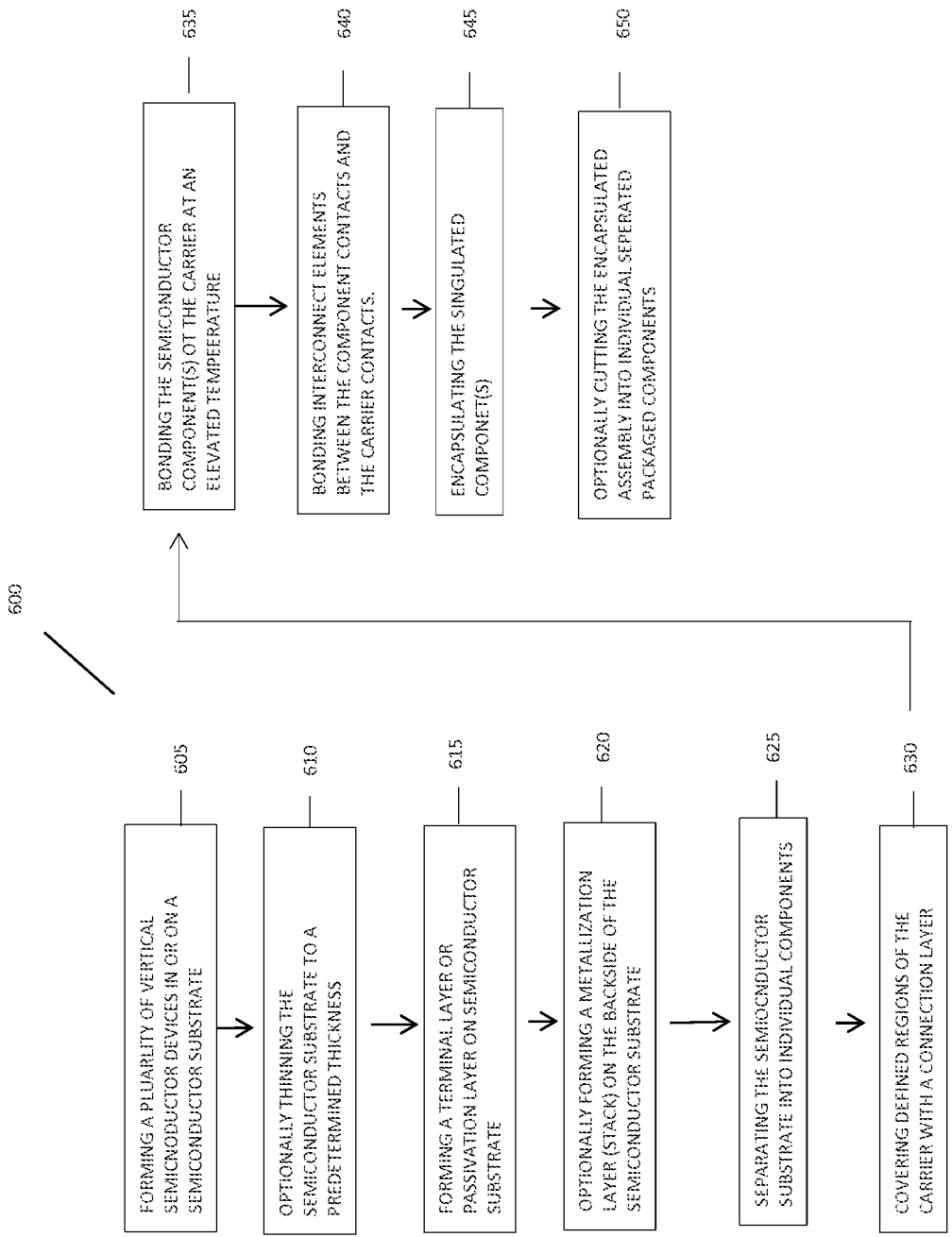
FIG. 6 shows an embodiment of a method for packaging a vertical power chip.

FIG. 6 illustrates an embodiment of a method for making a packaged component 600 comprising a vertical power semiconductor component having compressive stress.

In step 605, one or more vertical devices are manufactured in or on the semiconductor substrate (e.g., the wafer). The vertical devices may comprise integrated circuits (IC). Step 605 represents a sequence of conventional processing steps involving lithography, dry or wet etching, thin film deposition, implantation, chemical mechanical polishing (CMP) and metrology steps.

In step 610, the semiconductor substrate is optionally thinned. The substrate is thinned by grinding or lapping, for example. Lapping tools employ a liquid, called "slurry", comprising abrasive materials which act on the substrate surface exposed to the slurry. Grinding tools may use an abrasive wheel. Alternatively, Chemical Mechanical Polishing (CMP) may be applied which relies on a combination of chemical attack and mechanical abrasion. The semiconductor substrate is thinned down to 40 µm, 30 µm, 20 µm or 10 µm, for example.

In step 615, a terminal (or passivation) layer comprising electrically insulated contact pads is formed on the top surface of the semiconductor substrate. Similar techniques may be applied as with respect to step 605.

In step 620, the semiconductor substrate is temporarily glued to a support wafer. The semiconductor substrate may be glued with its top surface to the support wafer. A backside metallization (BSM) layer is deposited on the backside of the semiconductor substrate. The BSM layer may comprise one or more metal or metal alloy layers. Embodiments of material options and thickness ranges were previously discussed. The BSM layer may be sputtered on the semiconductor substrate.

Sputtering may involve the ejection of atoms from a negatively biased target (using bias voltages of −300 V or more) due to the impact of highly energetic positively charged ions created in a low pressure atmosphere under the influence of an electric field. Magnetron systems are frequently applied to produce DC or RF electrical fields, both of them being applicable for the sputtering of conductive materials. The sputter gas typically comprises a noble gas such as Ar. The material ejected from the target is deposited as a thin film on the substrate such as a wafer made of silicon or an alternative semiconductor material. The substrate is generally kept at a temperature between about 200° C. to about 400° C. in order to improve film density and film adhesion to the substrate.

In general, the stress created within a deposited film may comprise two components, thermal stress and intrinsic stress. Thermal stress comes into play if the deposition occurs at an elevated temperature and the CTE values of deposited film material and of the material onto which the film is disposed differ. Intrinsic stress is related to the microstructure of the deposited film. Intrinsic stress may be either compressive or tensile. Intrinsic stress may become a significant contributor to the overall stress developed in a sputter-deposited film if the deposition temperature is lower than one fifth of the melting point (MP) of the sputtered material. This condition may be met in practice, especially if copper (MP 1083° C.) or aluminum (MP 660° C.) layers are part of a BSM stack.

Development of intrinsic compressive stress is generally attributed to a so-called atom "peening" mechanism wherein bombardment with high-energy species induce a tighter packing of atoms in the deposited layer. Compressive intrinsic stress in sputter-deposited films may be facilitated by an increase of the energy and/or the flux of the metal and noble gas ions arriving at the substrate. This may be achieved, for example, by applying a negative bias to the substrate or by operating in a regime of very low pressure (e.g., by employing an Ar pressure of a few mT only).

In step 625 the processed semiconductor substrate is separated into individual chips. The semiconductor substrate may be cut by a saw or a laser, for example.

In step 630 forming a connection layer material (e.g., conductive layer material) over defined regions at the top surface of a carrier. As already discussed previously, the conductive layer may comprise a solder material or a conductive organic adhesive material. Diffusion solder materials such as AuSn, CuSn, CuSn or AgIn may be applied by blanket deposition over the whole carrier surface using electroplating, vapor deposition or evaporation sputtering techniques. Subsequently selective removal of solder material from carrier regions intended to be solder-free may be achieved using laser ablation employing high-energy lasers (Nd:YAG or excimer lasers), or by conventional lithography followed by dry or wet etching.

Alternatively, a solder paste material may be selectively deposited applying techniques such as rim shielding, spray or sprinkle application, or stencil printing. Drying in an oven or by applying hot air may remove the solvent remaining in the paste. Subsequently the solder paste may be baked/cured for a few minutes at temperatures in the range between about 100° C. to about 250° C.

The mechanical properties of diffusion as well as soft solder materials may vary widely within each group, depending on the nature and weight ratio(s) of the metals involved. In average, diffusion solder materials are more rigid than soft solder materials. For example, the Young modulus of Au80Sn20 is 68 GPa, whereas the Young modulus is only 41 GPa for Sn63Pb37.

Alternatively electrically conductive adhesive materials used as connecting layer may be applied in form of so-called pre-forms, i.e. pre-fabricated portions of adhesive foils. The thickness of preforms may vary between 5 µm and 50 µm. Some preforms comprise a UV-sensitive component. Such materials may be UV-cured after application. Depending on the preform thickness, the curing time may vary between about 1 s to about 20 s. Preforms not sensitive to UV light may be cured thermally at temperatures ranging between about 130° C. and about 160° C. Thereby curing times may vary between about 20 s and about 60 s.

In step 635, one or more chips are bonded to the carrier. A first chip is picked up with conventional pick & place equipment and placed over a predefined location on the carrier, the BSM-covered side of the chip facing the carrier. The chip is accurately aligned and then bonded to the preheated carrier. In high volume manufacturing pick-up, placement and chip-to-carrier bonding are generally repeated for a large number of chips.

The bonding temperature depends on the nature of the connecting material disposed on the carrier. Thermo-compression bonding at temperatures ranging between about 300° C. and about 400° C. may be applied for the attachment of chips to carriers covered with diffusion solder material. For example, exemplary processing conditions for Au75Sn25 solder bonding are: solder thickness 1200 nm, bonding temperature 360° C., bonding time 350 ms, bond force 3.3 N/mm$^2$, bond soft delay 150 ms, usage of bonding tunnel with forming gas (85% N$_2$+15% H$_2$) atmosphere. Bonding involving soft solder materials may occur at temperatures in the range of about 220° C. to about 240° C., again under reducing atmosphere.

Bonding of electrically conductive adhesive films or pastes may be carried out at temperatures between about 180° C. and about 250° C. Bonding pressure may vary from about 1 MPa to about 5 MPa. Bonding times may vary between about 1 and about 2 mins. The bonding temperature may possibly be raised up to 20° C. below the temperature at which decomposition of the adhesive material sets in. This may improve the rigidity of the adhesive layer and reduce its effectiveness to act as a stress buffer mitigating stress emanating from the die/carrier joint into the semiconductor substrate.

In the next step 640 interconnection elements are attached to component contact pads and carrier contact pads (e.g., lead frame out-pads). Wire bonds used as interconnects may be attached using techniques such as ultrasonic, thermo-compression or thermosonic bonding. Ultrasonic bonding utilizes ultrasonic energy with a frequency range of about 20 kHz to about 60 kHz at room temperature. Ultrasonic bonding times are around 20 ms. Thermo-compression bonding is carried out at temperatures between about 300° C. and about 500° C., applying bond loads of 15 g to 25 g per wire bond. Thermosonic bonding uses a combination of heat, ultrasonic energy and pressure. Thermosonic bonding may be carried at lower temperatures and lower pressures than thermo-compression bonding. Temperatures ranging from about 125° C. to about 150° C. and bond loads between 0.5 g and 2.5 g per bond wire are sufficient.

In step 645 the carrier and attached component(s) and interconnection elements are fully or partially encapsulated. The encapsulation material may comprise a molding compound, a laminate or a glob top coating. Encapsulation techniques such as compression molding, transfer molding, injection molding, power or liquid molding, dispensing or laminating may be applied for the encapsulation with a dielectric material.

In step 650, the encapsulated carrier and component(s) are separated into individual packaged components (individual packaged components may comprise more than one component). For example, individual lead frame units may be punched out from a lead frame sheet or a larger carrier plate may be cut into smaller units by sawing or laser application.

Although the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An assembled device comprising:
    a carrier;
    a connection layer disposed on the carrier, the connection layer comprising a first height; and
    a chip disposed on the connection layer, the chip comprising a second height, wherein the chip comprises a compressive stress along the second height, and wherein the second height is smaller than the first height.

2. The assembled device according to claim 1, wherein the second height is equal or less than 40 µm and wherein the first height is equal to or greater than 40 µm.

3. The assembled device according to claim 2, wherein the connection layer comprises a conductive adhesive paste.

4. The assembled device according to claim 2, wherein the connection layer comprises a conductive adhesive foil.

5. The assembled device according to claim 2, wherein the connection layer comprises a soft solder.

6. The assembled device according to claim 1, wherein the second height is equal to or less than 5 µm and wherein the first height is equal to or greater than 5 µm.

7. The assembled device according to claim 6, wherein the connection layer comprises a diffusion solder layer.

8. The assembled device according to claim 1, wherein the connection layer is a backside metallization layer (BSM).

9. The assembled device according to claim 1, the chip is a vertical power semiconductor device.

10. The assembled device according to claim 1, wherein the chip comprises silicon carbide (SiC).

11. A packaged power device comprising:
a leadframe;
a connection layer disposed on a carrier;
a vertical power semiconductor chip disposed on the connection layer, wherein the vertical power semiconductor chip comprises a vertical compressive stress over an entire height of the vertical power semiconductor chip;
interconnects connecting chip contact pads to leads of the leadframe; and
an encapsulation encapsulating the vertical power semiconductor chip.

12. The packaged power device according to claim 11, wherein the vertical compressive stress is equal to or greater than 100 MPa.

13. The packaged power device according to claim 11, wherein the height of the vertical power semiconductor chip is equal to or less than 40 µm.

14. The packaged power device according to claim 13, wherein the connection layer comprises a soft solder layer, a conductive adhesive foil or a conductive adhesive paste, and wherein the connection layer comprises a height of equal to or greater than 40 µm.

15. The packaged power device according to claim 11, wherein the height of the vertical power semiconductor chip is equal to or less than 10 µm.

16. The packaged power device according to claim 15, wherein the connection layer comprises a diffusion solder layer, and wherein the diffusion solder layer comprises a height of equal to or less than 10 µm.

17. The packaged power device according to claim 11, wherein a CTE of the leadframe is greater than 15 ppm/K, and wherein a CTE of a substrate of the power semiconductor chip is between 2 ppm/K and 7 ppm/K.

18. An assembled device comprising:
a carrier;
a connection layer disposed on the carrier, the connection layer comprising a first height; and
a chip disposed on the connection layer, the chip comprising a second height, wherein the chip comprises a compressive stress along the second height, wherein the chip does not comprise a tensile stress at a surface facing away from the carrier, and wherein the second height is smaller than the first height.

* * * * *